(12) United States Patent
Anderson et al.

(10) Patent No.: US 9,284,185 B2
(45) Date of Patent: Mar. 15, 2016

(54) INTEGRATED CIRCUIT SWITCHES, DESIGN STRUCTURE AND METHODS OF FABRICATING THE SAME

(71) Applicant: INTERNATIONAL BUSINESS MACHINES CORPORATION, Armonk, NY (US)

(72) Inventors: Felix P. Anderson, Colchester, VT (US); Thomas L. McDevitt, Underhill, VT (US); Anthony K. Stamper, Williston, VT (US); Julio C. Costa, Oak Ridge, NC (US); Jonathan H. Hammond, Oak Ridge, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/027,939

(22) Filed: Sep. 16, 2013

(65) Prior Publication Data
US 2014/0017844 A1    Jan. 16, 2014

Related U.S. Application Data

(62) Division of application No. 12/548,697, filed on Aug. 27, 2009, now Pat. No. 8,569,091.

(51) Int. Cl.
*B81C 1/00*    (2006.01)
*B81B 3/00*    (2006.01)
(Continued)

(52) U.S. Cl.
CPC ............ *B81C 1/0015* (2013.01); *B81B 3/0018* (2013.01); *B81C 1/00333* (2013.01); *G06F 17/5068* (2013.01); *H01L 21/302* (2013.01);
(Continued)

(58) Field of Classification Search
CPC .................... B81C 2201/0105; B81C 1/00476
USPC ............................................................ 438/52
See application file for complete search history.

(56) References Cited

U.S. PATENT DOCUMENTS 5,258,097 A    11/1993    Mastrangelo
5,578,976 A    11/1996    Yao
(Continued)

FOREIGN PATENT DOCUMENTS

CN    101417783    4/2009
CN    101492149    7/2009
(Continued)

OTHER PUBLICATIONS

International Search Report and Written Opinion, Application Serial # PCT/US2010/045248, Date Mailed Feb. 21, 2011, Title: "Dual height sacrificial MEMS cavity" Filing Date: Aug. 12, 2010.
(Continued)

*Primary Examiner* — Yu-Hsi D Sun
(74) *Attorney, Agent, or Firm* — Michael LeStrange; Andrew M. Calderon; Roberts Mlotkowski Safran & Cole, P.C.

(57) ABSTRACT

Integrated MEMS switches, design structures and methods of fabricating such switches are provided. The method includes forming at least one tab of sacrificial material on a side of a switching device which is embedded in the sacrificial material. The method further includes stripping the sacrificial material through at least one opening formed on the at least one tab which is on the side of the switching device, and sealing the at least one opening with a capping material.

16 Claims, 8 Drawing Sheets

(51) Int. Cl.
*G06F 17/50* (2006.01)
*H01L 21/302* (2006.01)

(52) U.S. Cl.
CPC ... *B81B 2201/014* (2013.01); *B81C 2203/0136* (2013.01); *B81C 2203/0145* (2013.01)

(56) References Cited

U.S. PATENT DOCUMENTS

| | | | |
|---|---|---|---|
| 5,586,203 | A | 12/1996 | Spaulding et al. |
| 6,127,812 | A | 10/2000 | Ghezzo et al. |
| 6,465,280 | B1 | 10/2002 | Martin et al. |
| 6,605,043 | B1 | 8/2003 | Dreschel et al. |
| 6,822,304 | B1 | 11/2004 | Honer |
| 6,872,984 | B1 | 3/2005 | Leung |
| 6,953,985 | B2 | 10/2005 | Lin et al. |
| 7,008,812 | B1 | 3/2006 | Carley |
| 7,145,213 | B1 | 12/2006 | Ebel et al. |
| 7,187,489 | B2 | 3/2007 | Miles |
| 7,234,357 | B2 | 6/2007 | Silverbrook et al. |
| 7,259,449 | B2 | 8/2007 | Floyd |
| 7,265,429 | B2 | 9/2007 | Wan |
| 7,684,104 | B2 * | 3/2010 | Chui et al. ............... 359/290 |
| 8,653,699 | B1 | 2/2014 | Dening et al. |
| 2002/0185699 | A1 * | 12/2002 | Reid ............... 257/414 |
| 2004/0028602 | A1 | 2/2004 | Franz et al. |
| 2004/0188785 | A1 * | 9/2004 | Cunningham et al. ........ 257/415 |
| 2006/0002885 | A1 | 1/2006 | Mielke et al. |
| 2006/0066936 | A1 | 3/2006 | Chui et al. |
| 2006/0216847 | A1 | 9/2006 | Tada et al. |
| 2007/0047173 | A1 * | 3/2007 | Reid, Jr. ............... 361/277 |
| 2008/0135998 | A1 | 6/2008 | Witvrouw et al. |
| 2008/0297992 | A1 | 12/2008 | Obata et al. |
| 2009/0071807 | A1 * | 3/2009 | Kominato et al. ............ 200/181 |
| 2009/0101383 | A1 | 4/2009 | Miyagi et al. |
| 2009/0188709 | A1 * | 7/2009 | Kojima et al. ............... 174/260 |
| 2011/0049649 | A1 | 3/2011 | Anderson et al. |
| 2011/0233674 | A1 * | 9/2011 | Sleight et al. ............... 257/347 |

FOREIGN PATENT DOCUMENTS

| | | |
|---|---|---|
| CN | 101493498 | 7/2009 |
| JP | 0784839 | 3/1995 |
| JP | 2008296336 | 12/2008 |
| JP | 2009178815 | 8/2009 |
| TW | 244512 | 12/2005 |
| TW | 312527 | 7/2009 |
| WO | 03052364 | 6/2003 |

OTHER PUBLICATIONS

In Response to Examination Report, Application No. GB1203306.4, dated Jan. 31, 2014, 6 pages.
In Response to the Combined Search and Examination Report for Application No. 1321363.2 dated Jan. 31, 2014, 5 Pages.
Examination Search Report, Application No. GB1203306.4, dated Aug. 30, 2013, 3 pages.
Chinese Office Action dated Nov. 15, 2014 in related Application No. 201080035440.0, 12 pp.

* cited by examiner

INTEGRATED CIRCUIT SWITCHES, DESIGN STRUCTURE AND METHODS OF FABRICATING THE SAME

FIELD OF THE INVENTION

The invention relates to integrated circuit switches and methods of manufacturing, and more particularly, to integrated MEMS switches, design structures and methods of fabricating such switches.

BACKGROUND

Integrated circuit switches used in 3D and other integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e. resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever structure. In the cantilever structure, a cantilever arm (suspended electrode) is pulled toward a fixed electrode by application of a voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

In MEMS cantilever type switches the fixed electrodes and suspended electrode are typically manufactured using a series of conventional photolithographic, etching and deposition processes. In one example, after the suspended electrode is formed, a layer of sacrificial material, e.g., the spin-on polymer PMGI made by Microchem, Inc., is deposited under the MEMS structure, to form a cavity, and over the MEMS structure to form a cavity. The cavity over the MEM is used to support the formation of a cap, e.g., SiN dome, to seal the MEMS structure. To remove the sacrificial material from within the SiN dome, vent holes are printed in the top of the dome directly above the MEMS structure. However, this poses several shortcomings.

For example, printing vent holes in the top of the dome is a difficult process due to the variability of the photoresist on the curvature on the dome, e.g., requiring printing in more than one focal plane. Once the vent holes are formed and the material, e.g., PMGI, within the dome is removed (using, for example, a downstream oxygen plasma, preferably at 125 C or greater to increase the removal rate; or a dip NMP solvent, performed in a spray or tank tool), it is necessary to seal the dome. The sealing process includes, for example, depositing another cap (SiN or silicon dioxide) over the dome and within the vent holes. During this sealing process, though, the SiN or silicon dioxide material also deposits on the suspended electrode and, in some case, the fixed electrodes. This is due to the location of the vent holes, i.e., directly over the MEMS structure. The SiN (or other material) deposited on the suspended electrode generates a dimensional variability of the suspended electrode which results in unwanted stresses and variability in the pulling voltage. The latter is due to a change, for example, in the spring constant of the suspended electrode. On the other hand, SiN (or other) material deposited on the fixed electrodes results in a higher contact resistance, also an unwanted effect of the deposition of SiN material occurring through the vent holes. The deposition of the sealing dielectric through the vent holes onto the MEMS structure can also happen if the cavity vent holes are sealed with a spin-on dielectric or polymer.

In addition, horizontal cantilever or bridge beam type switches, in many current applications, are known to stick, e.g., exhibit an inability to open the switch due to freezing closed during processing and the relatively small contact or actuation gap used in the switch. This is known as sticktion. This may be due, for example, the wet etching processes used to strip the sacrificial material from under the cap.

In general, wet release processes are simple to use, since such processes can have high lateral etch rates (higher than dry processes). However, with wet release processes, surface tension during the release process can cause the MEMS elements to stick together, resulting in failure of the MEMS. With the dry release processes, on the other hand, lateral etching of the sacrificial material is required. In dry etching processes, to fully remove the sacrificial material, lateral etching is required, often for tens of microns. This is challenging and can take about 0.1-10 hours per wafer, which is expensive. In dry release silicon methodologies, silicon is used as the sacrificial material if a $XeF_2$ or other lateral silicon etch process is used. $XeF_2$ etching has two drawbacks. For example, $XeF_2$, a nuclear reaction by-product, is very expensive, e.g., to remove 5 μm of silicon through 1 μm wide slits can take greater than 1 hour per wafer and can cost more $100 per wafer. In addition, depositing silicon at temperatures compatible with BEOL wiring (i.e., <400° C.) can only be performed using PECVD or PVD. However, PECVD silicon is a challenging process to perform because it is difficult and challenging to clean the silicon from the PECVD chamber walls. Also, PVD silicon is available but is expensive due to the relatively low PVD deposition rates (<100 nm/minute). Using dry release polymer methodologies is very difficult if the lateral aspect ratio is >>1 (as it is for most applications). Using dry release $SiO_2$-based dielectric is very difficult if the lateral aspect ratio is >>1 (as it is for most applications).

Accordingly, there exists a need in the art to overcome the deficiencies and limitations described hereinabove.

SUMMARY

In an aspect of the invention, a method of manufacturing a switch comprises forming at least one tab of sacrificial material on a side of a switching device which is embedded in the sacrificial material. The method further comprises stripping the sacrificial material through at least one opening formed on the at least one tab which is on the side of the switching device. The method additionally comprises sealing the at least one opening with a capping material.

In an aspect of the invention, a method of manufacturing a MEMS switch comprises: forming MEMS structures temporarily embedded in a sacrificial material; forming a capping layer over the MEMS structures; opening a vent hole in the capping layer on a side of the MEMS structures; stripping the sacrificial material to form a void about the MEMS structures using a dry or wet etchant; and sealing the vent hole with a capping material.

In an aspect of the invention, a method of forming a structure comprises performing a wet etching process to strip sacrificial material that embeds a lower and upper portion of an active device formed within a dome structure. The method further comprises performing a dry etching process to strip a layer of a thin sacrificial layer deposited on a lower metal layer of the active device.

In an aspect of the invention, a MEMS structure comprises: a lower forcing electrode and a lower contact electrode, remote from the lower forcing electrode; a cantilever beam positioned above the lower forcing electrode and the lower contact electrode; and a capping layer which hermetically seals the lower forcing electrode, the lower contact electrode and the cantilever beam. The capping layer has a sealed portion positioned on a side of the lower contact electrode, remote from the lower forcing electrode and an end portion of the cantilever beam.

In another aspect of the invention, a design structure embodied in a machine readable medium for designing, manufacturing, or testing an integrated circuit is provided. The design structure comprises the structures and/or methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuit switches and methods of manufacturing, and more particularly, to integrated MEMS switches, design structures and methods of fabricating such switches. In implementation, the invention includes various methods and structures of several novel MEMS switches. Advantageously, the methods of forming the structures reduces overall stress on the MEMS structure, reduces material variability as well as reduces contact resistance of the MEMS switch. Additionally, the various methods of the present invention eliminates sticktion, e.g., eliminates the inability of the switch to open due to freezing closed during processing.

In embodiments, the MEMS switches are fabricated using an opening formed remote from the MEMS device (compared to a conventional structure which has an opening directly over the MEMS device). That is, the opening (vent hole) of the present invention is not formed over any portion of the MEMS device. In embodiments, this can be accomplished by depositing sacrificial material along a lower edge of the MEMS dome to form one or more tabs. In optional embodiments, the sacrificial material may be deposited during the deposition of the sacrificial material in a lower cavity, upper cavity or during a separate deposition process. One or more openings are formed in the dome over the one or more tabs in order to remove the sacrificial material within the dome. The opening(s) can then be sealed with a capping material to hermetically seal the MEMS device. As the opening(s) is remote from the MEMS structures, the capping material will not be deposited on any MEMS structures, e.g., cantilever beam or contact electrode, thereby reducing stress, material variability and contact resistance of the MEMS device.

Figure 1:
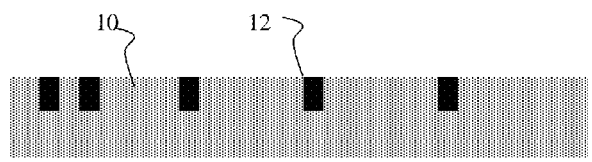
FIGS. 1-8 show intermediate structures and respective processing steps in accordance with aspects of the invention.

FIG. 1 shows a beginning structure comprising a layer of inter-metal dielectric 10. As should be understood by those of skill in the art, the dielectric material 10 may be an M+1 wiring level in an integrated circuit. Although not shown in FIG. 1, the dielectric material 10 may be provided on a wafer of any known type used with the formation of integrated circuits. For example, the wafer can be silicon, SOI, SiGe, quartz, sapphire, glass or Gallium arsenide, to name a few. In embodiments, the dielectric layer 10 is $SiO_2$; although, other dielectric materials are also contemplated by the invention. The dielectric layer 10 could be deposited using any known method, such as plasma-enhanced chemical vapor deposition (PECVD).

Wires 12 are formed in the dielectric layer 10 using known methods. For example, a plurality of vias is formed using conventional lithographic processes. A resist is deposited on the dielectric material 10 and selective portions of the resist are exposed to form openings. In subsequent processes, the dielectric material 10 is etched using a conventional process such as, for example, reactive ion etching (RIE) to form vias. The vias are filled with known metals or metal alloys to form the wires 12. The resist can be stripped away.

In embodiments, the wires 12 can be formed using single- or dual-damascene copper; or subtractive-etch aluminum wire techniques. The wires 12 can also be metallized using any known combination of processes such as, for example, physical vapor deposition (PVD), chemical vapor deposition (CVD), electroplated deposition (ECP), metal-organo chemical vapor deposition (MOCVD), etc. In one exemplary embodiment, the wires can be tungsten plugs, with TiN liners. In another embodiment, the wires 12 are formed using copper with TaN/Ta liners. In another embodiment, the wires 12 are formed by a sub-etch AlCu or AlCuSi process employing damascene tungsten vias or tapered AlCu vias between wiring levels.

Figure 2:
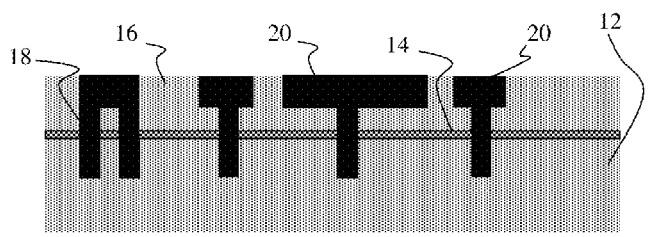

In FIG. 2, an optional SiN layer 14 is deposited over the dielectric layer 10, using any conventional deposition method such as, for example, CVD. A second inter-metal dielectric layer 16 is deposited on the SiN layer 14, in a similar manner as described above with reference to the dielectric layer 10. Using a single or dual damascene process known to those of skill in the art, wiring layers 18 and 20 are formed in the SiN layer 14 and the dielectric layer 16, making contact with the underlying metal wiring layer 12. The wiring may be, for example, copper wiring.

Figure 3:
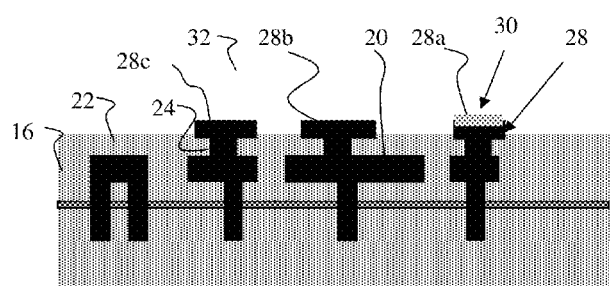

As shown in FIG. 3, dielectric layer 22 is deposited on the structure of FIG. 2. The dielectric layer 22 may be about 0.5 microns in height, and deposited using conventional techniques such as those described above. Thereafter, wiring layers 24, 28 are formed using conventional processes. For example, using conventional lithographic and etching processes, vias are formed in the dielectric layer 22. Conductive material is blanket deposited on the dielectric layer 22, including within the vias. The conductive material may be Al, Cu, AlCu TaN, Ta, or TiN, for example.

In embodiments, a thin layer of a robust contact metallurgy, such as gold, 30 can be deposited and patterned on the conductive material and in particular a lower contact electrode 28a. In embodiments, the thin layer of gold 30 is approximately 100 nm; although, other dimensions are contemplated by the invention. Any known method can be used to deposit the gold, such as physical vapor deposition (PVD), metal-organic chemical vapor deposition (MOCVD), evaporation, electroplating, or the like. Alternatively, in embodiments, the thin layer of the robust contact metallurgy could be the uppermost film of wiring layer 28.

Once deposited, the wiring layer 28 can be patterned using conventional lithography and etching processes to form the pattern shown in FIG. 3, for example. The pattern includes wiring 28a that will act as a lower electrode for the MEMS switch and a forcing electrode 28b that will force the switch into contact with the lower electrode 28a. It should be understood by those of skill in the art that different patterns are also contemplated by the present invention. In embodiments, a gold wet etch selective to the underlying metal, e.g., TiN or AlCu, can be used to pattern the wires 28. In alternate embodiments, the wires 28 can be selectively plated with gold, post RIE and clean.

Figure 4:
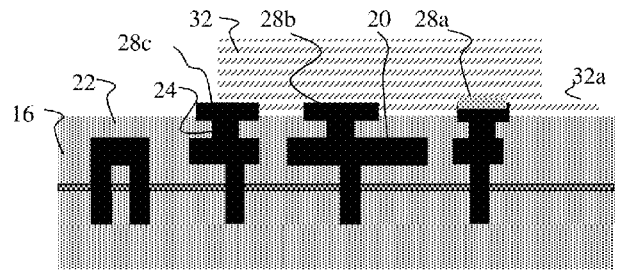

In FIG. 4, a sacrificial material is deposited on the structure of FIG. 3 to form what will eventually be a cavity below the MEMS structure. The sacrificial material 32 can be sputtered Si or an organic polymer such as, for example, Polymethylglutarimide (PMGI), spin-on glass, or photosensitive polyimide (PSPI). PMGI is compatible with most g-line, i-line, and DUV photoresists and has excellent adhesion to Si, SiN, NiFe, Cu, Au, GaAs, and other III-V/III-VI materials. PMGI also exhibits a high thermal stability and can be applied in any conventional manner such as, for example, spin-coating. In embodiments, the sacrificial material 32 can be deposited to extend over the wiring 28 (e.g., wiring 28a, 28b and 28c). The sacrificial material can also be deposited and patterned to include one or more tabs (e.g., extended portions) 32a, on the side of the structure. In embodiments, the tab(s) 32 are formed using a separate deposition process than the sacrificial layer used to support the formation of the cantilever beam of the MEMS structure. In this scenario, the structure is a dual height structure; although, as discussed in more detail below, the tab(s) 32 can be formed in a same process as the sacrificial material resulting in a height of about an underside of the cantilever beam. In embodiments, the tab(s) 32a can be at any location, remote from the MEMS structure. In one example, the tab(s) 32a can be at a corner of the structure. In another example, the tab(s) 32a can be at multiple corners of the structure, or along one or more sides of the structure. (See, FIG. 12.) In any scenario, the tab(s) 32 are located on a side of the MEMS structure.

In embodiments, the sacrificial material can be about 50 microns wide and about 200 microns long, with the tab(s) 32a about 0.2 microns in height and about 10 microns in length. The tab(s) 32a will be remote from the MEMs structure, e.g., on a side of the MEMs structure and will preferably have a substantially horizontal, planar surface with respect to the surface of the structure.

Figure 5:
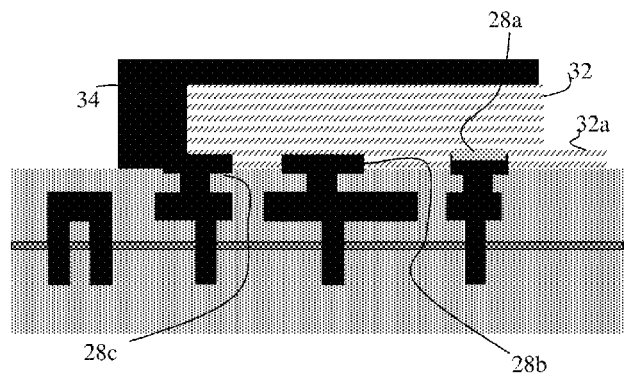

As shown in FIG. 5, a material, preferably conductive or a combination of conductive and insulative materials, is formed on the sacrificial material 32 and is in contact with the exposed portion of wiring 28c to form a cantilever beam 34, e.g., an upper electrode of the switch. The material in the upper electrode of the switch could be formed by, for example, depositing, patterning, and etching; or by patterning, depositing, and using a lift off method. In embodiments, the cantilever beam 34 is approximately 100 microns long and about 0.5 to about 10 microns thick to provide certain rigidity to the structure; although, other dimensions are also contemplated by the present invention. Although layer 34 is shown as a single monolithic material, it could be multilayers of conductor and insulators, with one or more patterning steps (not shown) to form a composite beam as discussed supra in FIGS. 16-18.

The cantilever beam 34 also extends above the contact wiring 28a and forcing electrode 28c, by a predetermined distance. In embodiments, the predetermined distance between the forcing electrode 28c and a bottom surface of the cantilever beam 34 is about 0.1 microns to about 5 microns; although other dimensions are also contemplated by the invention. The above-noted dimensions ensure that the forcing electrode 28b can force the cantilever beam 34 downwards, in contact with the lower electrode 28a (formed from the patterned wire 28). Although a cantilever beam is shown, any MEMS beam, such as a bridge (i.e. fixed on both ends) could be used.

In embodiments, the conductive material for the cantilever beam 34 can be any conductive material such as, for example, Al, Ti, TiN, Cu, Au, AlCu or gold or any combination thereof; and the insulator, if used, could be any combination of insulators including silicon dioxide, silicon nitride, alumina, etc. In embodiments, the cantilever beam 34 can be, for example, an electroplated (ECP) gold with a refractory liner on an underside thereof. In still further embodiments, the cantilever beam 34 can be AlCu with a gold liner on an underside thereof, formed using conventional processes such as PVD. In still another alternate embodiment, the cantilever beam 34 can be AlCu with an ECP gold coating. In this latter embodiment, the ECP gold coating can be formed on an underside of the cantilever beam 34, or both an underside and top surface of the cantilever beam 34.

Figure 6:
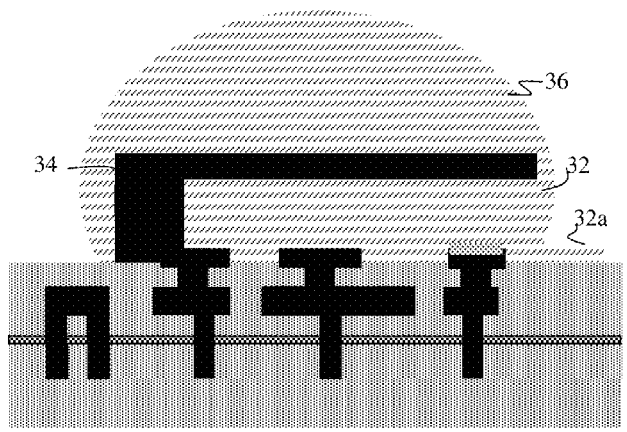

In FIG. 6, a sacrificial material 36 is deposited on the structure of FIG. 5 to form what will be an upper cavity over the team. The sacrificial material 36 can be, for example, silicon, PSPI, or PMGI. The sacrificial material 36 can thus be the same material as used for the sacrificial material 32, or a different material. In alternative embodiments, the tab(s) 32a may be formed in this processing step.

Figure 7:
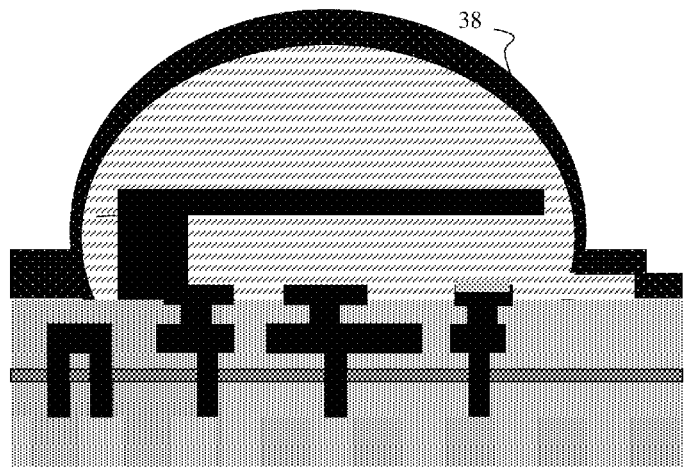

In FIG. 7, a cap 38 is formed over the structure of FIG. 6. More specifically, the cap 38 is a hard cap such as, for example, a silicon dioxide, SiN, or multilayer dielectric liner that is deposited on the sacrificial material 36, the tab(s) 32a and other portions of the structure. The cap 38 formed over the tab(s) 32a will preferably be planar with a single focal plane. The deposition of the cap 38 can be by any conventional deposition processes such as, for example, CVD or PVD processes. In embodiments, the cap 38 is about 3 microns thick.

Figure 8:
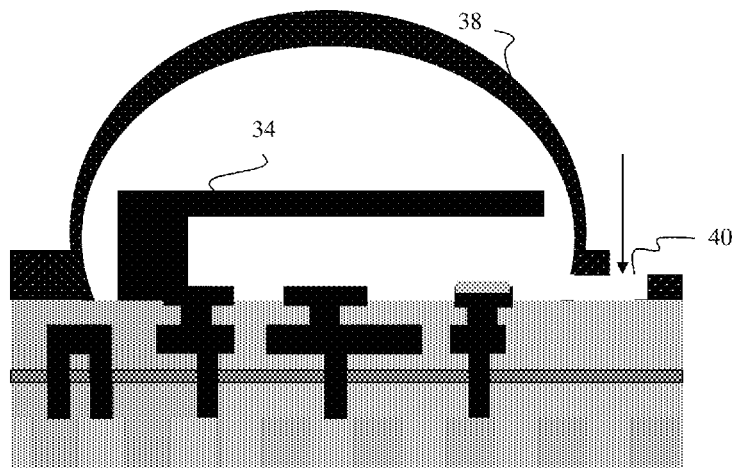

FIG. 8 shows an etching and stripping processes in accordance with the invention. More specifically, in FIG. 8, opening 40 is formed in the cap 38 and more particularly on the tab(s) 32a, remote from the MEMS structure. The opening 40 can be formed using conventional etching processes such as, for example, RIE. The opening 40, in embodiments, can be fully aligned (directly over) or offset (partially aligned) with respect to the tab(s) 32a. In the representation of FIG. 8, the opening 40 is offset with respect to the tab(s) 32a; although FIG. 8 equally represents an alignment of the opening 40 with the tab(s) 32a. The opening is remote from an end of the cantilever beam 34.

As the opening 40 is provided on one or more or any combination of the tab(s) 32a, it will be patterned in a single focal plane, remote from the MEMS structure. The opening 40 can be about 1 micron wide and can consist of either square or rectangular shapes. If rectangular shapes are used, then rectangles about 1 micron wide to about 10 microns or longer in length, depending on the dimensions of the tab(s), would be used. Those of skill in the art will readily recognize, though, that other dimensions of the opening 40 are also contemplated by the present invention.

As further shown in FIG. 8, the sacrificial material within the cap is stripped resulting in a void within the cap 38. For example, the sacrificial material can be stripped using a dry or wet etch chemistry, through the opening 40. More specifically, in the case of PMGI, for example, the PMGI can be stripped in N-methyl-2-pyrrolidine (NMP) and/or dimethylsulfoxide (DMSO)-based removers. Also, PMGI is DUV, E-beam, and x-ray sensitivity, as well as exhibits a high etch rate in oxygen plasma as used in a downstream asher, high density plasma RIE chamber, or parallel plate RIE chamber. Although any known method of oxygen plasma stripping is envisioned, the PMGI removal rate is enhanced if the wafer temperature during the PMGI removal is >100 C (e.g. 150 C). As mentioned previously, other sacrificial materials, such as silicon deposited by any known method, i.e. PVD, CVD, etc., could be used. If silicon is used for the sacrificial material, then it would be removed using a lateral downstream silicon etch tool, for example, a tool using $XeF_2$ gas, as known in the art. Additionally, if silicon is used as the sacrificial material, exposed wire and via surfaces to the silicon etchant gas or liquid could need to be coated in a dielectric or conductor which is not etched by the silicon etch, prior to the silicon etch.

Figure 9:
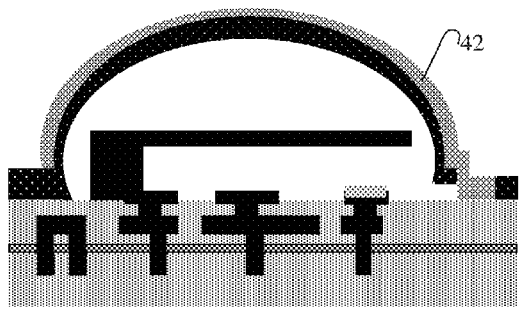
FIG. 9 shows a final MEMS structure and respective processing steps in accordance with aspects of the invention.

FIG. 9 shows a final structure and respective processing steps. In particular, FIG. 9 shows the opening sealed by a deposition of a SiN, silicon dioxide, or multilayer material 42, using a conventional deposition process. The SiN material 42 may be, for example, about 2 microns thick. In this way, the MEMS switch is hermetically sealed within the cap 38, 42. The seal is remote from an end of the cantilever beam 34.

As the opening is remote from the MEMS switch, the SiN material 42 is not deposited on the cantilever beam 34 or the contact electrode 28a (or other MEMS structures). Instead, the SiN material 42 is deposited on the cap 32 and within the opening 40. As such, the dome is hermetically sealed without affecting, in any way, the MEMS structures. That is, the SiN material 42 will not be deposited on the cantilever beam 34 thereby avoiding any possible dimensional variability of the cantilever beam 34 which would cause unwanted stresses and variability in the pulling voltage. Also, the SiN material 42 will not be deposited on the fixed electrode (contact electrode 28a) thereby avoiding a higher contact resistance, also an unwanted effect of the deposition of SiN material occurring through the vent holes.

Figure 10:
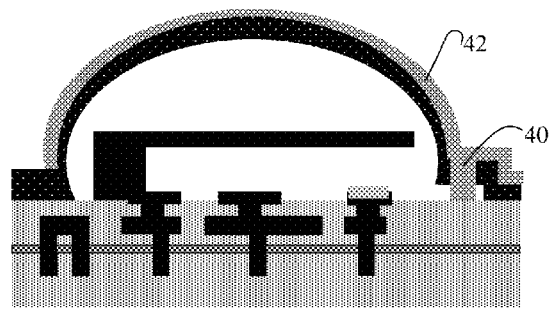
FIG. 10 shows an alternative final MEMS structure and respective processing steps in accordance with another aspect of the invention.

FIG. 10 shows an alternative final MEMS structure and respective processing steps in accordance with another aspect of the invention. More specifically, in FIG. 10, opening 40 is formed in the cap 38 and more particularly aligned directly over the tab(s) 32a, remote from the MEMS structure. As discussed above, the opening 40 can be formed using conventional etching processes such as, for example, RIE. After forming the opening, the sacrificial material is stripped resulting in a void within the cap 38. The opening 40 is sealed by a deposition of a SiN material 42, using a conventional deposition process. As the opening 40 is remote from the MEMS switch, the SiN material 42 is not deposited on the cantilever beam 34 or the contact electrode 28a thereby avoiding the deleterious affects noted above.

Figure 11:
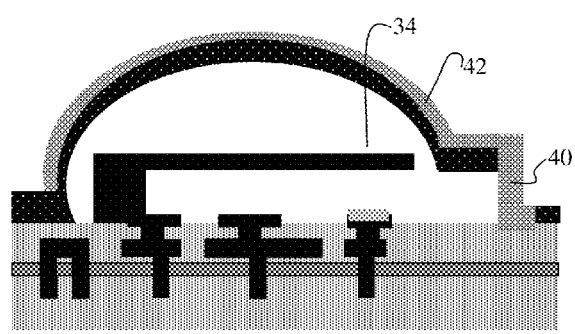
FIG. 11 shows an alternative final MEMS structure and respective processing steps in accordance with another aspect of the invention.

FIG. 11 shows an alternative final MEMS structure and respective processing steps in accordance with another aspect of the invention. In this embodiment, the tab(s) 32a are during (at the same time) the formation of the sacrificial material 32 used to support the cantilever beam 34 (and which embeds the lower structures of the MEMS device). The formation of the tab(s) 32a at the same time as the deposition of the sacrificial material reduces processing steps in that it is not necessary to have a separate deposition step, for example, to form the tabs. In this embodiment, the tabs(s) 32a are formed to a height of approximately the underside of the cantilever beam 34. (See, e.g., FIG. 4.)

In the embodiment shown in FIG. 11, the opening 40 is formed in the cap 38 on a side of the tab, also remote from the MEMS structure. It should be understood by those of skill in the art, that the opening can still be formed on the top of the cap, either aligned or offset from the tab. As discussed above, the opening 40 can be formed using conventional etching processes such as, for example, RIE. After forming the opening 40, the sacrificial material is stripped resulting in a void within the cap 38. The opening 40 is sealed by a deposition of a SiN material 42, using a conventional deposition process. Again, as the opening 40 is remote from the MEMS switch, the SiN material 42 is not deposited on the cantilever beam 34 or the contact electrode 28a thereby avoiding the deleterious affects noted above.

Figure 12:
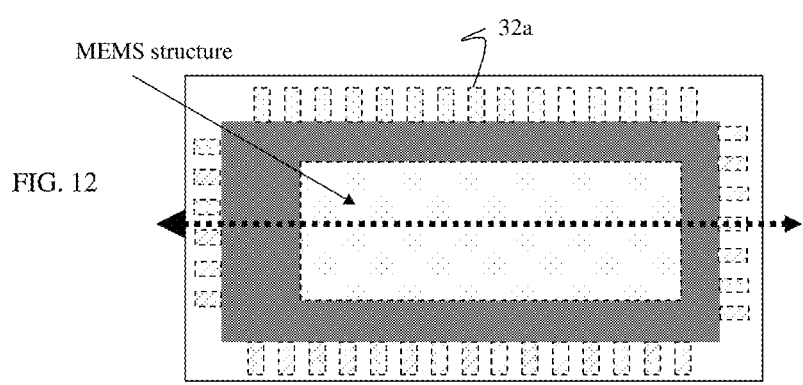
FIG. 12 shows a top plan view representative of any of the structures shown in FIGS. 9-11.
Figure 13:
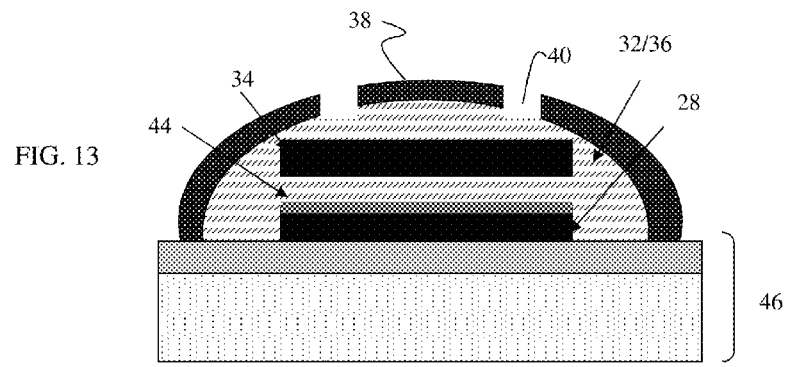
FIGS. 13 and 14 show alternative intermediate structures and respective processing steps in accordance with another aspect of the invention.

FIG. 12 shows a top plan view representative of any of the structures shown in FIGS. 9-11. In particular, FIG. 13 shows tabs 32a extending from the sides and/or corners of the structure, remote from the active region (MEMS structures). The tabs 32 are represented in dashed lines, showing that the placement along the sides and/or corners may be at multiple positions or a single position or any combination thereof.

Figure 14:
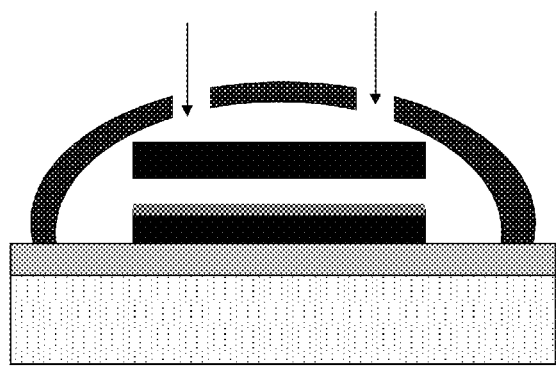
Figure 15:
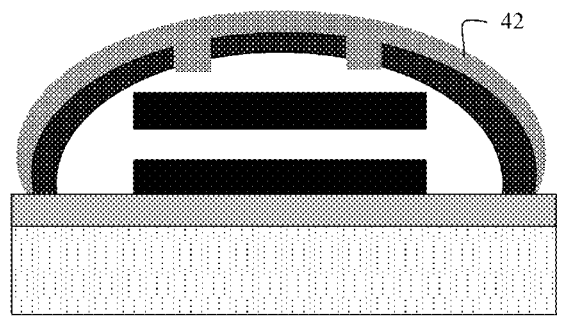
FIG. 15 shows an alternative final structure and respective processing steps in accordance with the structures of FIGS. 12 and 13.

FIGS. 13-15 show an alternative structure and processing steps in accordance with another aspect of the invention. In particular, FIGS. 13-15 show a two step wet/dry sacrificial MEMS layer removal process to avoid sticktion associated with pure wet removal methodologies.

More specifically, FIG. 13 shows an intermediate structure fabricated using conventional fabrication processes. The structure of FIG. 13 includes a substrate with BEOL devices, generally depicted at reference numeral 42. The substrate includes active, passive and memory devices as should be understood by those of skill in the art. The active, passive and memory devices can be fabricated using conventional lithographic, etching and deposition processes, known to those of skill in the art. The BEOL devices include wires, vias and passive devices, also fabricated in a conventional manner. Deposited on the BEOL layer is a wiring layer 28. The wiring layer 28 may be representative of a forcing electrode and contact electrode, as discussed above.

A sacrificial layer 44 is deposited on the wiring layer 28 (in a lower portion of the cavity), using conventional deposition methods. The sacrificial layer 44 can be a sacrificial silicon layer deposited using, for example, PVD. Alternatively, the sacrificial layer 44 could be any material, such as Dow Chemical SiLK™, which is a Poly(arylene) Ether, diamond like carbon, or any material which will not be removed by the release process used for the subsequent sacrificial layers 32/36. The sacrificial layer 44 is a thin layer which can range from about 10 nm to about 1 micron, with one illustrative example being about 50 nm. The sacrificial layer 44 prevents sticktion that might occur during wet etching processes.

The structure of FIG. 13 also includes a cantilever beam 34. The cantilever beam 34 and wiring layer 28 are embedded within a sacrificial material 32/36, PMGI or another material that will be wet released, as discussed above. As shown in FIG. 13, the sacrificial layer 44 is provided between the cantilever beam 34 and wiring layer 28. A cap 38 is formed over the structure to form a dome structure. The cap 38 can be, for example, SiN. A plurality of openings 40 are formed in the cap 38, using conventional printing methodologies.

FIG. 14 shows a layer 32/36 vent stripping process using wet etchants. The stripping process can use different etchants depending on the sacrificial material 32/36 used to form the MEMS structures. For example, Table 1 shows the use of different etchants as contemplated by the invention.

TABLE 1

| SACRIFICIAL MATERIAL | WET ETCH |
| --- | --- |
| PMGI (polymer) | NMP |
| Cu | Sulfuric-Peroxide |
| PVD Si | KOH |
| THCVD SiO$_2$ or SOG | BHF |

FIG. 15 shows a dry etch removal process and a sealing process in accordance with this aspect of the invention. More specifically, after the wet etch process is complete, the sacrificial layer 44 is removed using a dry etch process. For example, XeF$_2$ downstream etch can be used to strip sacrificial silicon material. Alternatively, N$_2$/H$_2$ or O$_2$ Magnetically Enhanced Reactive Ion Etching (MERIE) plasma etch, O$_2$ or O$_2$/O$_3$ downstream etch can be used to strip Poly(arylene) Ether. In any scenario, the dry etchant will release the cantilever beam, thereby avoiding issues related to sticktion. A cap 42 is then deposited on the structure to seal the openings (vent holes). The cap 42 can be, for example, a SiN material.

Figure 16:
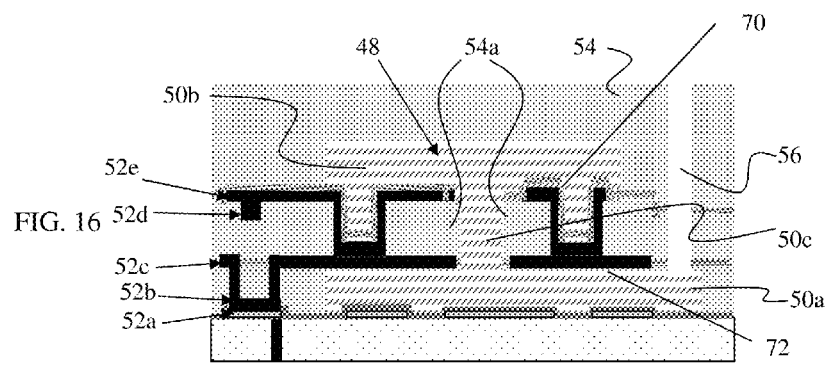
FIGS. 16 and 17 show alternative intermediate structures and respective processing steps in accordance with another aspect of the invention.
Figure 17:
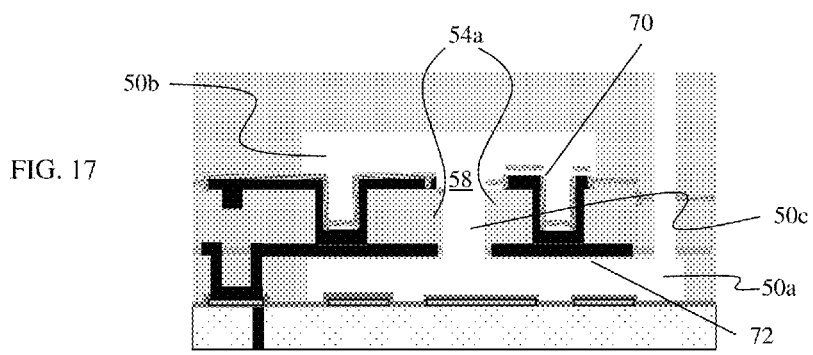
Figure 18:
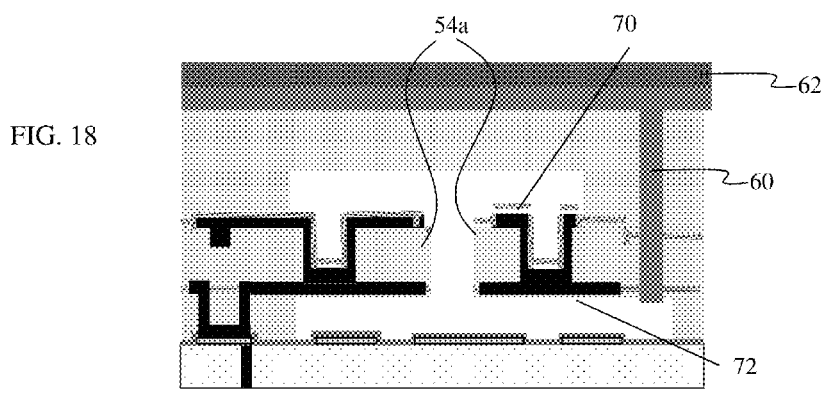
FIG. 18 shows an alternative final structure and respective processing steps in accordance with the structures of FIGS. 16 and 17.

FIGS. 16 and 17 show alternative intermediate structures and respective processing steps in accordance with another aspect of the invention where the cavities are formed using damascene processing. FIG. 18 shows an alternative final structure and respective processing steps in accordance with the structures of FIGS. 16 and 17. In particular, the structures of FIGS. 16-18 show a planar surface MEMS or other active structure.

More specifically, FIG. 16 shows an intermediate structure with a sacrificial material 48 formed in a lower cavity 50a, an upper cavity 50b and extending within a via 50c connecting the lower and upper cavities 50a, 50b. The cavities 50a, 50b and via 50c are formed using conventional lithographic and patterning processes, as should be understood by those of skill in the art. The sacrificial material 48 may be, for example, silicon. The structure of FIG. 16 further shows several wiring layers 52 formed by conventional lithographic, patterning and deposition processes. The wiring layers 52 can comprise any known metal or metal alloy, and may be coated, for example, with an oxide. In embodiments, the lower and upper cavities 50a, 50b are embedded within an oxide or other dielectric material 54. The upper surface of the oxide or other dielectric material 54 is planarized to form a planar surface. A via 56 is formed in the structure, including through the wiring layers 52c and 52e, the oxide layers 70, 72, and an insulator layer 54a between the wiring layers 52c and 52e. The via 56 extends to the lower cavity 50a. The wiring layer 52c is formed on the sacrificial material 48 in the lower cavity 50a. The insulator layer 54a is formed on the wiring layer 52c, and the wiring layer 52e is formed above the dielectric material 54a. In embodiments, the via 56 is formed remotely from the upper cavity 50b.

FIG. 17 shows a stripping process in accordance with this aspect of the invention. More specifically, the sacrificial material 48 is stripped using an etchant to form a void or a hollow space 58 within the via 50c and the lower and upper cavities 50a, 50b. As an example, the sacrificial material 48 can be stripped using a silicon etch such as, for example, XeF2 dry etch, KOH or NaOH wet etch.

In FIG. 18, the via 56 is sealed with a dielectric, such as silicon dioxide or silicon nitride as discussed above, material 60 for example. The oxide material 60 can be deposited within the via using a CVD, spin-on, or other process as discussed above. In one example, the nitride thickness is 0.8 μm, which seals off 1 μm diameter vent holes. The oxide deposition is performed remotely from the MEMS or other active structure. A nitride material 62, for example, is deposited on the oxide material 60. The nitride material 62 may be planarized using a CMP process, for example. In one embodiment, the nitride deposition includes a 3 mm 400° C. nitride deposition process.

Design Structure

Figure 19:
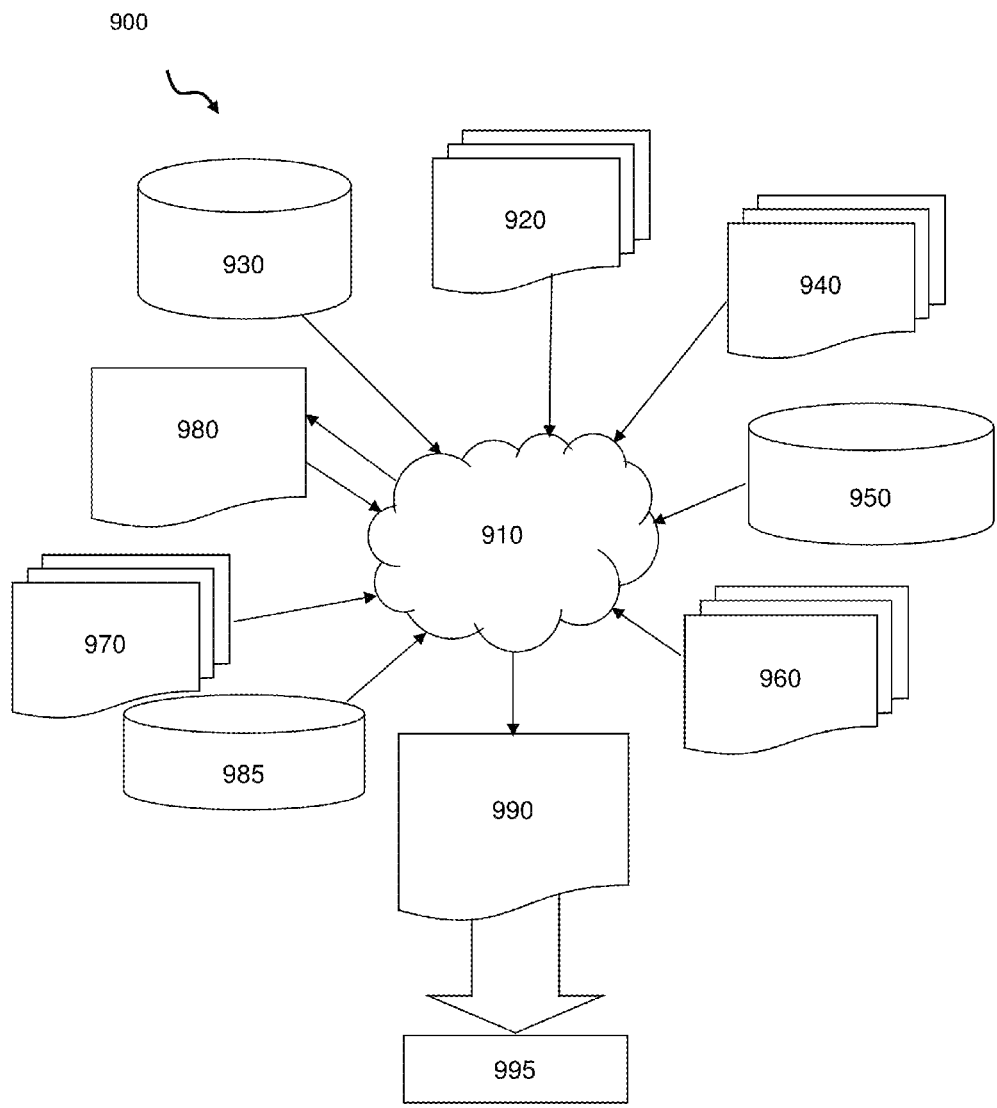
FIG. 19 is a flow diagram of a design process used in semiconductor design, manufacture, and/or test.

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-18. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-18 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-18. In one embodiment, design structure 990 may comprise a compiled, executable HDL simulation model that functionally simulates the devices shown in FIGS. 1-18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-18. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a structure, comprising:
depositing a first sacrificial material directly on a contact electrode and a forcing electrode of a switching device;
forming the switching device on the first sacrificial material;
forming at least one tab on a side of the switching device, which is embedded in the first sacrificial material, wherein the at least one tab is formed by depositing additional sacrificial material over a dielectric layer in a separate deposition process from that of the depositing of the first sacrificial material directly on the contact electrode and the forcing electrode;
depositing a second sacrificial material in a separate deposition process from that of the deposition of the additional sacrificial material, and the second sacrificial material is deposited on the switching device, on a side of the at least one tab formed with the additional sacrificial material;
depositing a cap layer on the second sacrificial material over the switching device and the at least one tab formed with the additional sacrificial material;
stripping the first sacrificial material, the second sacrificial material and the at least one tab through at least one opening formed in the cap layer on the at least one tab which is on the side of the switching device; and
sealing the at least one opening with an additional layer.

2. The method of claim 1, wherein the additional sacrificial material forming the at least one tab is deposited at a level lower than an underside surface of a cantilever beam which forms a upper structure of the switching device.

3. The method of claim 1, wherein the at least one opening is fully aligned over at the least one tab.

4. The method of claim 1, wherein the at least one opening is offset with respect to the at least one tab.

5. The method of claim 1, wherein the at least one opening is formed on a side of the at least one tab.

6. The method of claim 1, wherein the first sacrificial material is silicon and the stripping is performed using $XeF_2$ gas.

7. The method of claim 1, wherein the first sacrificial material is PMGI and the stripping is performed using N-methyl-2-pyrrolidine (NMP) and/or dimethylsulfoxide (DMSO)-based removers.

8. The method of claim 1, wherein the sealing the at least one opening with the additional layer eliminates material variability of a cantilever beam which forms a portion of the switching device.

9. The method of claim 1, wherein the cap layer and the additional layer are dielectric material.

10. The method of claim 1, wherein the additional layer completely fills the at least one opening.

11. The method of claim 1, further comprising forming a cantilever beam on the first sacrificial material, the cantilever beam forming an upper structure of the switching device, the cantilever beam comprising AlCu with an electroplated gold liner on an underside of the cantilever beam, and the at least one tab is formed at a corner of the structure.

12. The method of claim 1, further comprising forming a cantilever beam on the first sacrificial material, the cantilever beam forming an upper structure of the switching device, the first sacrificial material is about 50 microns wide and about 200 microns long, the additional sacrificial material is about 0.2 microns in height and about 10 microns in length, and the cantilever beam is about 100 microns long and about 0.5 microns to 10 microns thick.

13. A method in a computer-aided design system for generating a functional design model for manufacturing a physical MEMS structure, said method comprising:
generating a functional representation of a first sacrificial material deposited directly on a contact electrode and a forcing electrode of a switching device;
generating a functional representation of the switching device deposited on the first sacrificial material;
generating a functional representation of at least one tab deposited on a side of the switching device, which is embedded in the first sacrificial material, wherein the at least one tab is formed by depositing additional sacrificial material only directly on a dielectric layer in a separate deposition process from that of a deposition process used to deposit the first sacrificial material directly on the contact electrode and the forcing electrode;
generating a function representation of a second sacrificial material deposited in a separate deposition process from that of the deposition of the additional sacrificial material, and the second sacrificial material is deposited on the switching device, on a side of the at least one tab formed with the additional sacrificial material;
generating a functional representation of the first sacrificial material, the second sacrificial material and the at least one tab stripped through at least one opening formed on the at least one tab which is on the side of the switching device; and
generating a functional representation of the at least one opening sealed with a capping material deposited on the second sacrificial material over the switching device and the at least tab deposited with the additional sacrificial material.

14. The method of claim 13, wherein the at least one opening is offset with respect to the at least one tab.

15. The method of claim 13, wherein the at least one opening is formed on a side of the at least one tab.

16. The method of claim 13, further comprising manufacturing the physical MEMS structure.

* * * * *